(12) United States Patent
Zhu et al.

(10) Patent No.: US 7,883,976 B2
(45) Date of Patent: Feb. 8, 2011

(54) STRUCTURE AND METHOD FOR MANUFACTURING DEVICE WITH PLANAR HALO PROFILE

(75) Inventors: Huilong Zhu, Poughkeepsie, NY (US); Jing Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 11/955,515

(22) Filed: Dec. 13, 2007

(65) Prior Publication Data
US 2009/0152646 A1 Jun. 18, 2009

(51) Int. Cl.
*H01L 21/336* (2006.01)
(52) U.S. Cl. ......... 438/289; 438/197; 438/199; 438/225; 438/297; 257/E21.201; 257/E21.431
(58) Field of Classification Search .......... 438/185, 438/225
See application file for complete search history.

(56) References Cited
U.S. PATENT DOCUMENTS

| | | | |
|---|---|---|---|
| 6,630,385 B1 | 10/2003 | Yu | |
| 6,720,224 B2 | 4/2004 | Jeong | |
| 6,891,235 B1 * | 5/2005 | Furukawa et al. | 257/408 |
| 6,930,030 B2 | 8/2005 | Rausch et al. | |
| 7,041,538 B2 | 5/2006 | Ieong et al. | |
| 7,151,032 B2 | 12/2006 | Kim | |
| 2007/0057334 A1 | 3/2007 | Chidambarrao et al. | |

* cited by examiner

*Primary Examiner*—N Drew Richards
*Assistant Examiner*—Kyoung Lee
(74) *Attorney, Agent, or Firm*—Joseph Petrokaitis; Roberts Mlotkowski Safran & Cole, P.C.

(57) ABSTRACT

A semiconductor device and method for manufacturing the device with a planar halo profile is provided. The semiconductor device can be a MOSFET. The method of forming the structure includes forming an angled spacer adjacent a gate structure and implanting a halo implant at an angle to form a halo profile having low dopant concentration near a gate dielectric under the gate structure. The structure includes an underlying wafer or substrate and an angled gate spacer having an upper portion and an angled lower portion. The upper portion is structured to prevent halo dopants from penetrating an inversion layer of the structure. The structure further includes a low concentration halo dopant within a channel of a gate structure.

16 Claims, 13 Drawing Sheets

US 7,883,976 B2

STRUCTURE AND METHOD FOR MANUFACTURING DEVICE WITH PLANAR HALO PROFILE

FIELD OF THE INVENTION

The invention relates to a semiconductor device and method of manufacturing the same and, more particularly, to a structure and method for manufacturing a MOSFET with a planar halo profile.

BACKGROUND DESCRIPTION

Metal-oxide semiconductor (MOS) transistors generally include a substrate made of a semiconductor material, such as silicon. The transistors also include a source region, a channel region and a drain region within the substrate. The channel region is located between the source and the drain regions. A gate stack, which includes a conductive material gate or gate conductor on top of a gate oxide layer and sidewall spacers, is provided above the channel region. More particularly, the gate oxide layer is provided on the substrate over the channel region, while the gate conductor is provided above the gate oxide layer. The sidewall spacers help define locations of source and drain ion implantation and form self-aligned silicide.

The amount of current flowing through a channel of a semiconductor device is proportional to the mobility of the carriers in the channel. Thus, the operation speed of the transistor can be increased by increasing the mobility of the carriers in the channel. However, to obtain high performance of a MOSFET, it is necessary to scale down the channel length of the MOSFET. That is, the shorter the gate length results in a higher performance MOSFET. But, a shorter gate length requires a higher concentration of halo profile, which degrades carrier mobility or device performance.

Accordingly, there exists a need in the art to overcome the deficiencies and limitations described hereinabove.

SUMMARY OF THE INVENTION

In a first aspect of the invention, a method of forming a structure includes forming an angled spacer adjacent a gate structure and implanting a halo implant at an angle under the gate structure, which produces a halo profile with low concentration near the gate dielectric in the channel.

In another aspect of the invention, a method of forming a device includes etching layers above a substrate or wafer to form a trench having an angled surface in a (111) plane and forming an angled gate spacer within the angled opening, the angled gate spacer having a portion of its sidewall complimentary to the angled surface. The method further includes removing upper layers of the layers and performing an angled halo implant to form a halo profile with low concentration near the gate dielectric in the channel. The angled gate spacer prevents penetration into a gate structure. The method further comprising removing the angled gate spacer.

In a further aspect of the invention, an intermediate structure comprises an underlying wafer or substrate and an angled gate spacer having an upper portion and an angled lower portion. The upper portion is structured to prevent forming high halo dopants in the inversion layer of the structure. The structure further includes a low concentration halo profile near the gate dielectric within a channel of a gate structure.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention relates to a semiconductor device and method of manufacturing the same and, more particularly, to a structure and method for manufacturing a device with a planar halo profile. In embodiments, the device is a MOSFET. In implementation, the halo concentration in an inversion layer under a gate oxide is substantially lower than in the devices with conventional angled halo implantation. This low halo concentration improves device performance by increasing the electron and hole mobilities under the gate structure. Also, in implementation, it is possible to improve the short channel effect control of the device by providing a high dopant concentration away from the gate oxide. In embodiments, the advantages of the present invention are possible, at least partly, due to the formation of a fan out oxide spacer on sidewalls of the gate, prior to an angular halo implantation, as discuss in more detail below.

Figure 1:
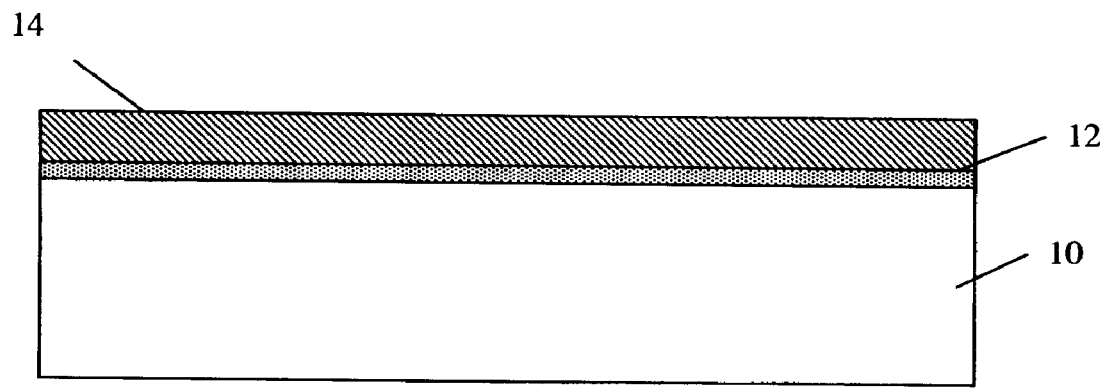
FIG. 1 shows a starting structure and processing steps in accordance with a first aspect of the invention.

FIG. 1 shows a beginning structure in accordance with one aspect of the invention. In this beginning structure, an epitaxial SiGe layer 12 is grown on a conventional bulk wafer 10. In embodiments, the bulk wafer can be replaced with a conventional SOI substrate. In embodiments, the SiGe is grown from a single crystal to a thickness of about 5 nm to about 10 nm. In further embodiments, the Ge content of the SiGe layer 12 is about 10-20%; although, it is contemplated that other percentages of Ge and thickness of the SiGe layer can be implemented with the invention. An epitaxial Si layer 14 is grown on the SiGe layer 12. In embodiments, the Si layer 14 is grown from a single crystal to a thickness of about 20 nm to about 50 nm.

Figure 2:
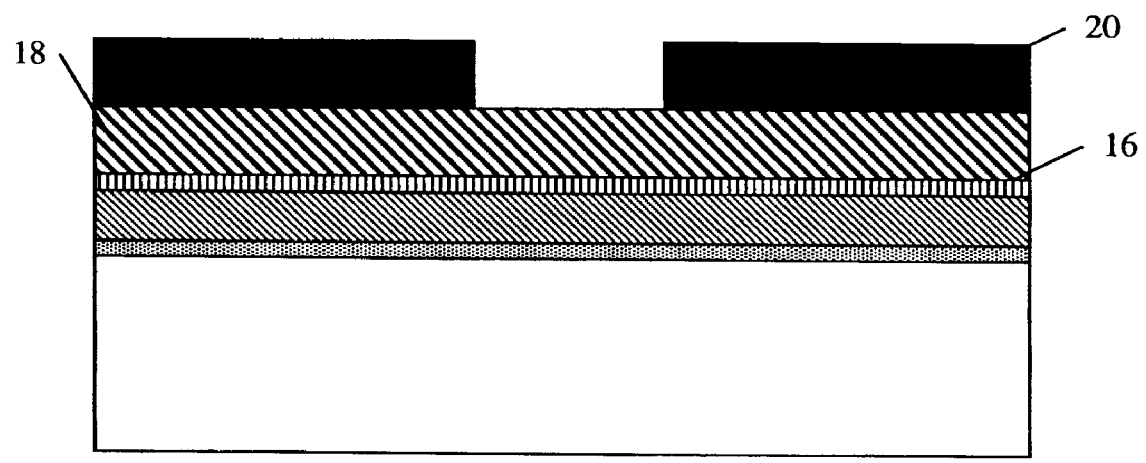
FIGS. 2-10 show processing steps and intermediate structures in accordance with the first aspect of the invention.

In FIG. 2, an oxide layer 16 is deposited on the Si layer 14. A nitride layer 18 is deposited on the oxide layer 16, with a photoresist 20 formed on the nitride layer 18. The photoresist 20 is patterned in a conventional manner known to those of skill in the art to form an opening to the underlying nitride layer 18. The thickness of the oxide layer 16 and the nitride layer 14 may vary depending on the particular application, as should be understood by those of skill in the art.

Figure 3:
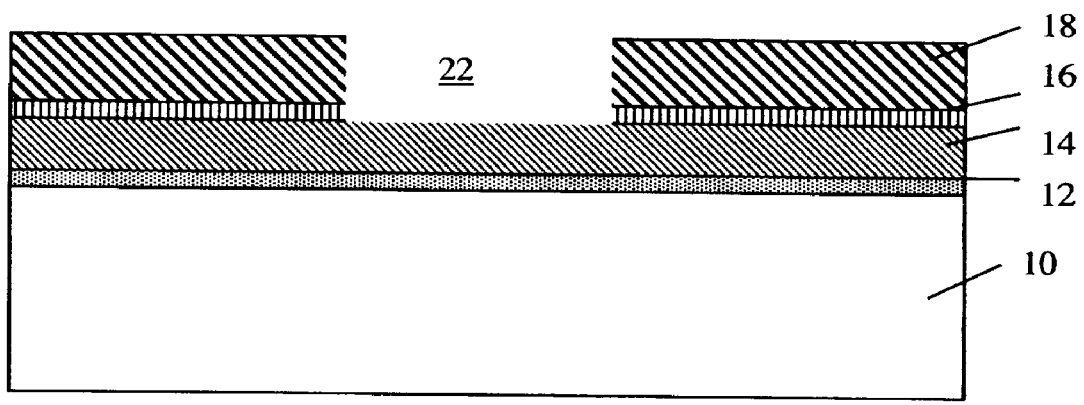

In FIG. 3, a reactive ion etching (RIE) is performed to remove portions of the nitride layer 18, through the opening of the patterned photoresist 20. A RIE process is then performed to remove portions of the oxide layer 16, which is selective to the Si layer 14. The photoresist 20 is removed in a conventional process known to those of skill in the art. The etching processes of FIG. 3 results in the formation of a trench 22.

Figure 4:
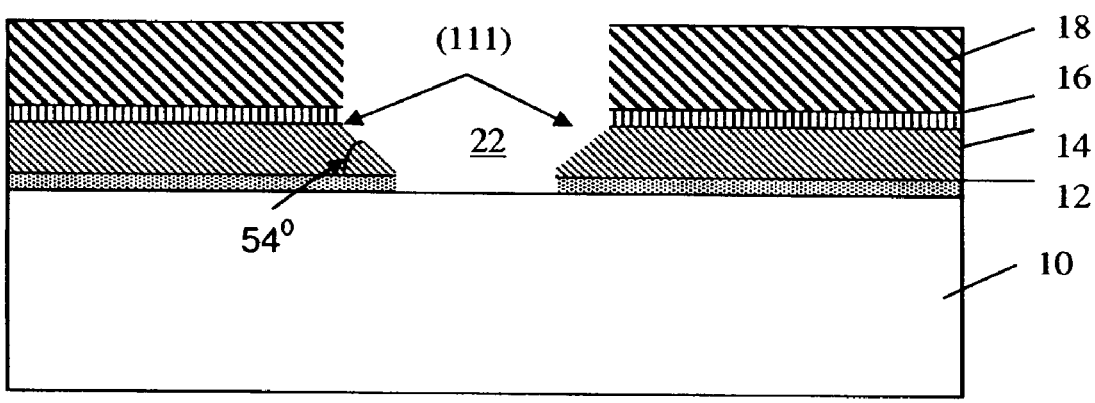

In FIG. 4, the trench 22 is further processed using an anisotropic wet etching process to etch portions of the Si layer 14, stopping at the SiGe 12. The anisotropic wet etching process forms an angled faced surface in the Si layer 14 in the (111) plane. In embodiments, the angled faced surface (e.g., (111) plane) is at about a 54° angle. The anisotropic wet etching process uses any known solution such as, for example, TMAH (Tetramethyl1 ammonium hydroxide) anisotropic wet etchant or KOH, to name a couple. In embodiments the TMAH is selective to SiGe at about 20:1 for 20% Ge. A RIE process selective to the underlying wafer is performed to etch the SiGe layer 12 to the wafer, completing the formation of the trench 22. As shown in FIG. 4, the bottom portion of the trench 22 (gate opening) is smaller than an upper portion thereof.

Figure 5:
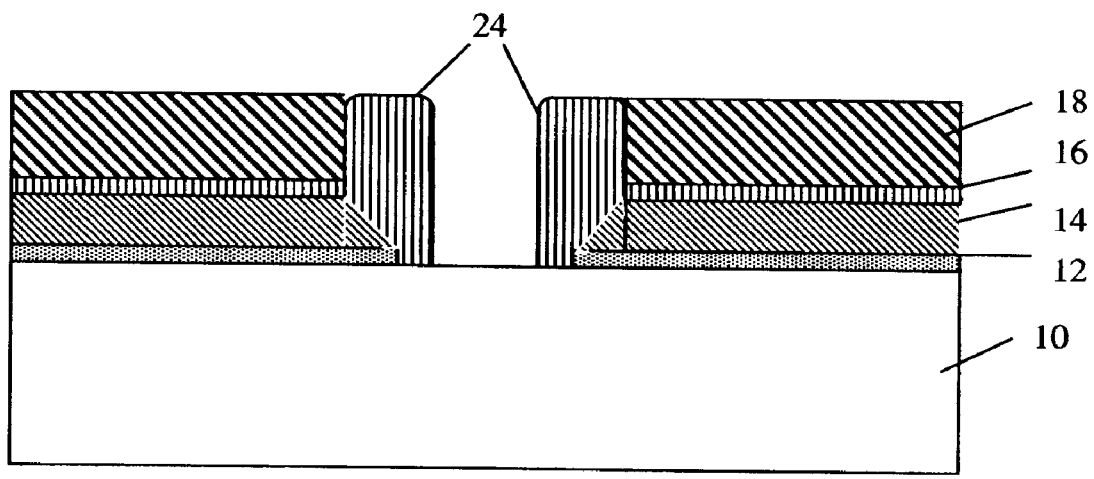

In FIG. 5, oxide is deposited within the trench 22 and etched away using a conventional RIE process to form angled oxide spacers 24. As seen from this processing step, the spacers 24 will have an angled surface, complimentary to the angled faced surface of the layer 14 in the (111) plane.

Figure 6:
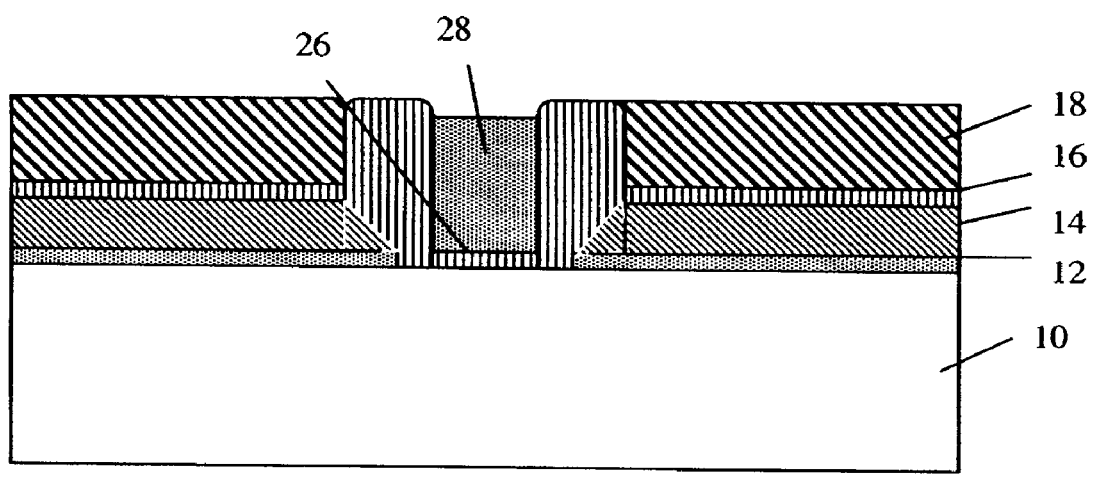

In FIG. 6, a gate oxide layer 26 is formed in the trench 22 using a thermal gate oxidation process known to those of skill in the art. A poly SiGe layer 28 is deposited in the trench 22, above the oxide layer 26. The poly SiGe layer 28 is etched back using conventional processes such as, for example, a wet etching process. In embodiments, the poly SiGe layer 28 has a content of about 1-5% Ge.

Figure 7:
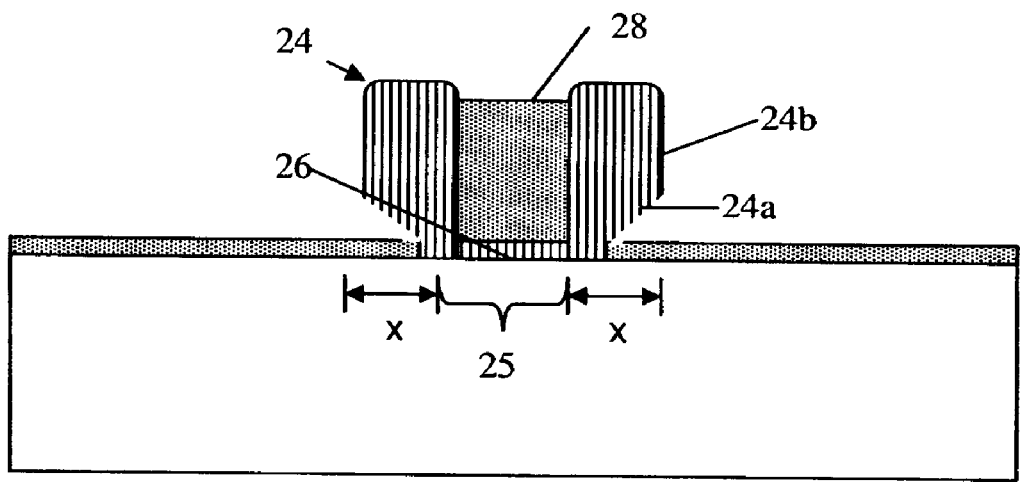

In FIG. 7, the nitride layer 18 is etched, selective to the underlying layers (e.g., oxide layer 16, Si layer 14 and SiGe layer 12) using a conventional etching process. In further processes, the oxide layer 16 is etched using a conventional RIE process, and the Si layer 14 is etched selective to the underlying SiGe layer 12 using a conventional etching process. The etching processes form a fan out oxide spacer 24, with a surface complimentary to the angled faced surface of the layer 14 in the (111) plane.

As thus seen, the oxide spacer 24 includes an angled surface 24a leading to sidewalls 24b extending beyond the channel 25 of the gate by a length "x" on each side of the gate. That is, the walls at reference numeral 24b are thicker than the walls at the angled surface 24a. In this manner, e.g., due to the shape of the fan out oxide spacer 24, dopants are blocked or prevented from penetrating into the gate structure and form a halo profile with low concentration near the gate dielectric in the channel region (inversion layer 27) during an angled halo implantation. This dopant profile leads to increased performance of the device due to higher electron/hole mobility, compared to the devices with conventional halo implantation.

Figure 8:
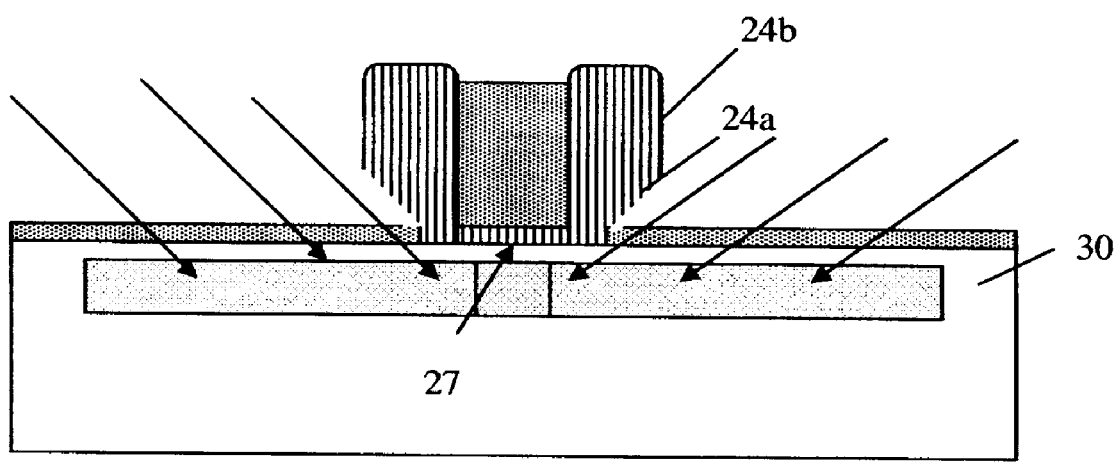

In FIG. 8, an optimized halo concentration doping, i.e., a halo profile with low concentration near the gate dielectric in the channel region, is performed into the wafer 10 (or substrate). In embodiments, the halo implant is guided by the angled oxide spacer 24, forming the short channel under the gate. As discussed above, though, the thicker portion of the fan out oxide spacer prevents the doping from penetrating into the gate structure. That is, dopant does not stop in the inversion layer 27 under the gate structure, due to the increased thickness of the sidewalls 24b. The inversion layer 27 is about 5 Å to 30 Å.

In embodiments, boron is used for the halo implantation of nMOSFET and arsenic is used for the halo implantation of pMOSFET. In embodiments, the low halo concentration doping is performed at an angle that substantially matches the angle of the fan out oxide spacer 24, e.g., about 36° to the normal of the gate dielectric. The dopant concentration, in embodiments, is about a few $10^{17}$ atoms/cm$^3$ or less near the gate dielectric in the channel. It should be recognized by those of skill in the art that dopant is blocked or substantially blocked from penetrating the gate structure (e.g., SiGe layer 28) due to the increased thickness of the fan out spacer at the gate level, denoted generally at reference numeral 24b.

Figure 9:
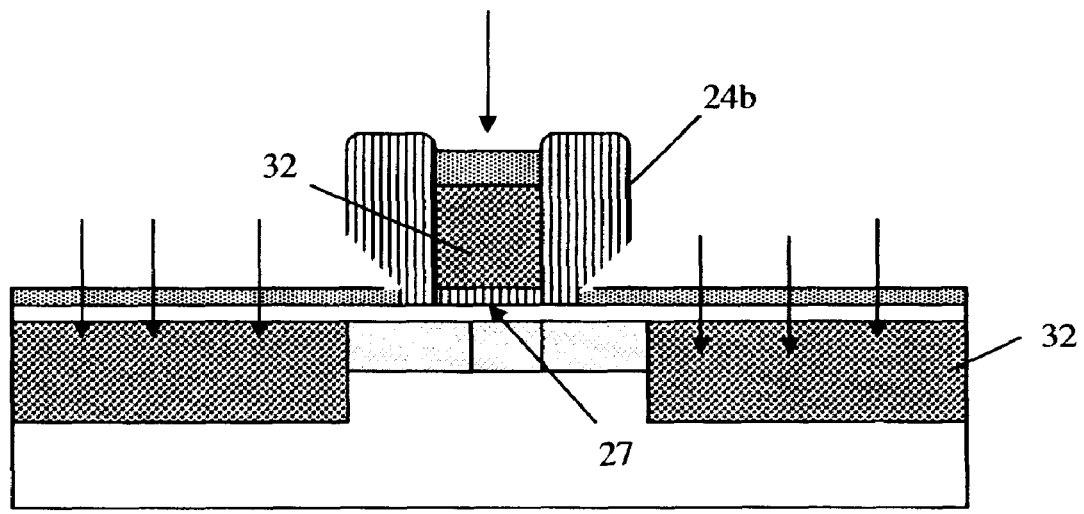

In FIG. 9, the source and drain regions are implanted using conventional implants and processes. For example, nMOSFET is implanted with arsenic at about an energy level of between 20 to 60 Kev at a dosage of about $1e^{15}$ to $5e^{15}$. pMOSFET is implanted with boron or BF$_2$. In the embodiment of boron, the boron can be implanted at an energy level of between 5 to 10 Kev at a dosage of about $1e^{15}$ to $5e^{15}$. In comparison, in the BF$_2$ embodiment, the BF$_2$ can be implanted at an energy level of between 20 to 50 Kev at a dosage of about $1e^{15}$ to $5e^{15}$. Regardless of the implant, it should be recognized by those of skill in the art that the implantation process will be performed away from the gate channel by a length of approximately "x", which is equivalent to the thickness of the oxide spacer 24 as represented by sidewall surface 24b. This ensures that a low concentration of dopant remains within the inversion layer 27 under the gate structure, while a higher concentration results at the source and drain regions.

Figure 10:
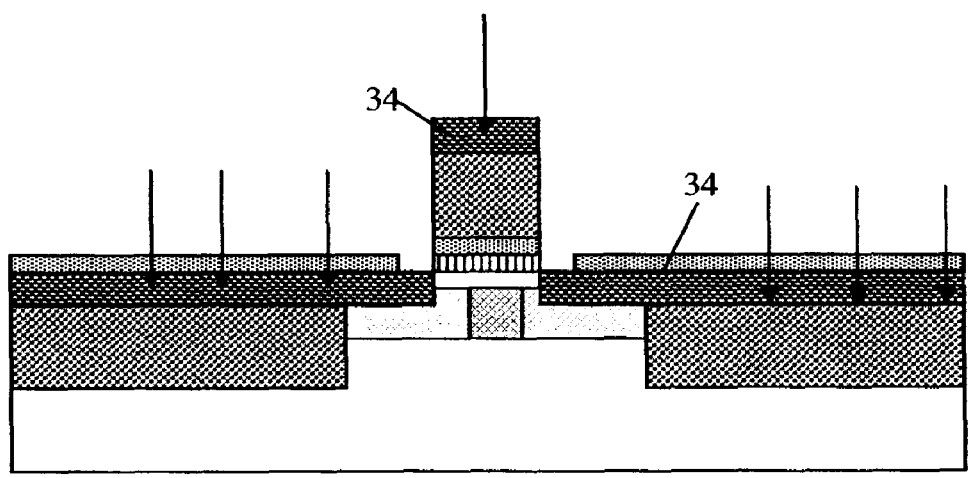

In FIG. 10, the fan out oxide spacer 24 is stripped away using a conventional RIE process. An extension implant is performed in the source and drain regions. More specifically, arsenic is implanted as an extension implant at the N+ side of the device and boron is implanted as an extension implant at the P+ side of the device. In embodiments, the arsenic and boron can be implanted at an energy of about 2-4 Kev and at a dosage of about $1e^{15}$ to $2e^{15}$. In embodiments using BF$_2$, the BF$_2$ is implanted at an energy of about 3-5 Kev.

Figure 11:
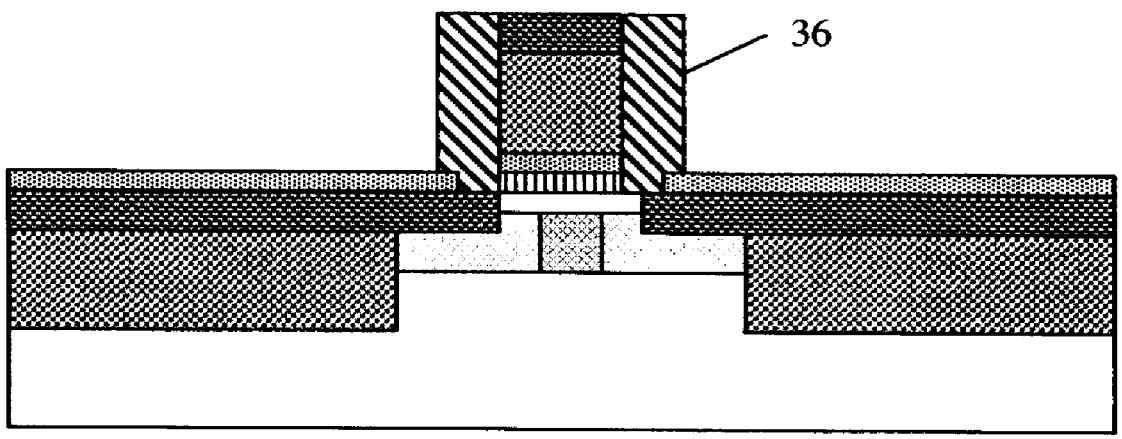
FIG. 11 shows processing steps and a final structure in accordance with the first aspect of the invention.

FIG. 11 shows a final structure and accompanying processes in accordance with the invention. In particular, a nitride spacer 34 is formed on the sidewalls of the gate structure using a conventional nitride spacer formation process. The source and drain regions are annealed using conventional processes at conventional temperatures to activate the dopants in the source and drain regions. During this annealing process, the nitride spacer 34 also undergoes silicidation. Subsequent to the annealing process, conventional processes can be used to build the device (e.g., silicidation and metal contacts, etc.)

Figure 12:
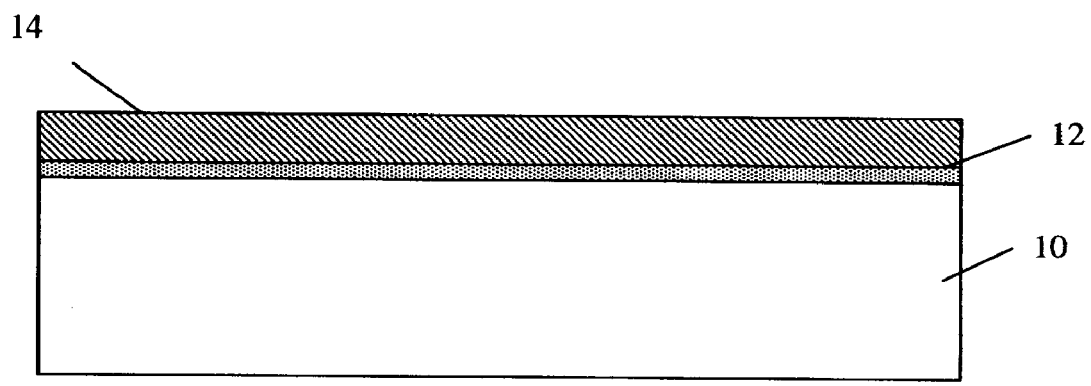
FIG. 12 shows a starting structure and processing steps in accordance with a second aspect of the invention.

FIG. 12 shows a beginning structure in accordance with a second aspect of the invention. Similar to the embodiment of FIG. 1, in this beginning structure, an epitaxial SiGe layer 12 is grown on a conventional bulk wafer 10. In embodiments, the bulk wafer can be replaced with a conventional SOI substrate. In embodiments, the SiGe is grown from a single crystal to a thickness of about 5 nm to about 10 nm. In further embodiments, the Ge content of the SiGe layer 12 is about 20%; although, other percentages of Ge and thickness of the SiGe layer are contemplated by the invention. An epitaxial Si layer 14 is grown on the SiGe layer 12, from a single crystal to a thickness of about 20 nm to about 50 nm.

Figure 13:
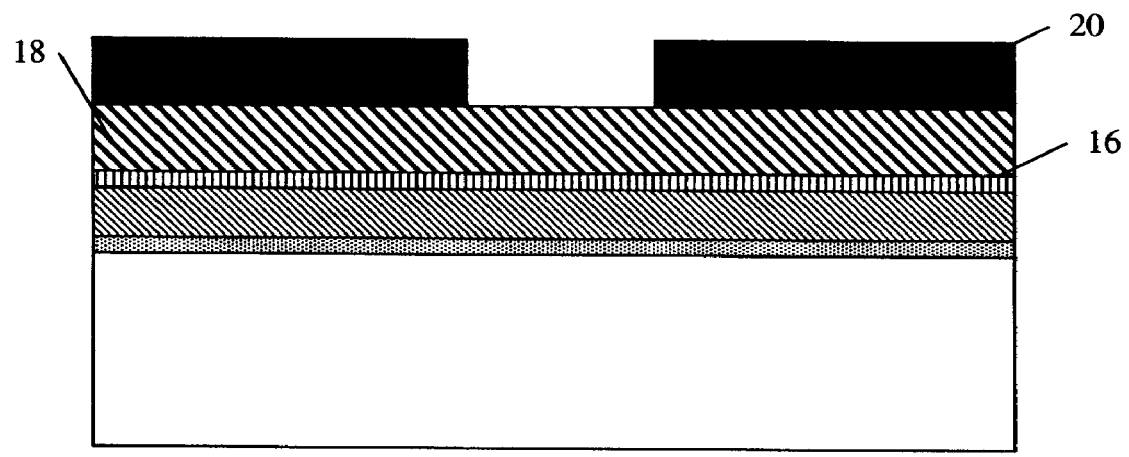
FIGS. 13-20 show processing steps and intermediate structures in accordance with the second aspect of the invention.

In FIG. 13, an oxide layer 16 is deposited on the Si layer 14. A nitride layer 18 is deposited on the oxide layer 16, with a photoresist 20 formed on the nitride layer 18. The photoresist 20 is patterned in a conventional manner known to those of skill in the art to form an opening to the underlying nitride layer 18.

Figure 14:
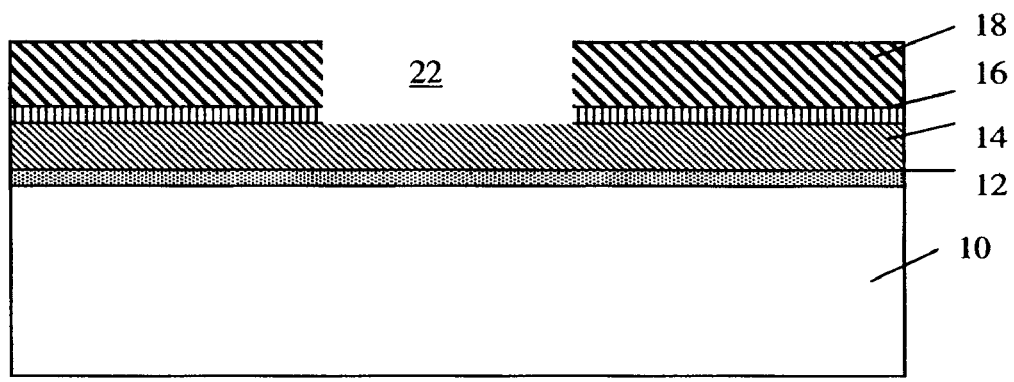

In FIG. 14, a reactive ion etching (RIE) is performed to remove portions of the nitride layer 18, through the patterned photoresist 20. A RIE process is performed to remove portions of the oxide layer 16, which is selective to the Si layer 14. The photoresist 20 is removed in a conventional process known to those of skill in the art. The etching processes of FIG. 14 result in the formation of a trench 22.

Figure 15:
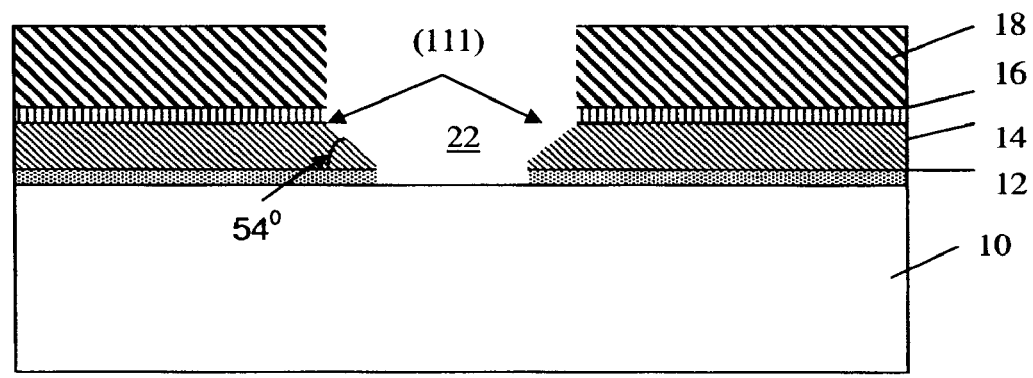

In FIG. 15, the trench 22 is further processed using an anisotropic wet etching process to etch portions of the Si layer 14, stopping at the SiGe 12. The anisotropic wet etching process forms an angled faced surface in the Si layer 14 in the (111) plane. In embodiments, the angled faced surface (e.g., (111) plane) is at about a 54° angle. Similar to above, the anisotropic wet etching process uses any known solution such as, for example, TMAH or KOH. A RIE process selective to the underlying wafer layer is performed to etch the SiGe layer 12 to the wafer, completing the formation of the trench 22. As shown in FIG. 15, the bottom portion of the trench 22 (gate opening) is smaller than an upper portion thereof.

Figure 16:
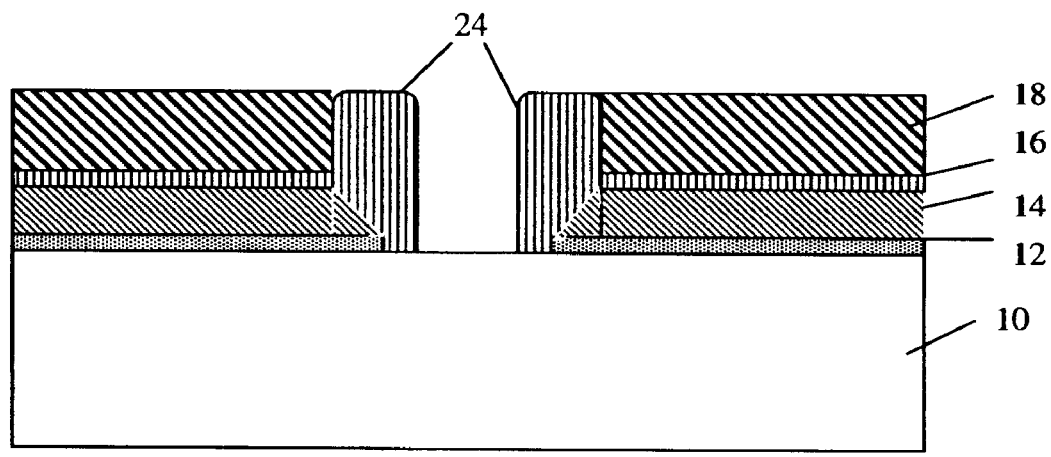

In FIG. 16, oxide is deposited within the trench 22 and etched away using a conventional RIE process to form angled oxide spacers 24. The spacers 24 will have an angled surface, complimentary to the angled faced surface of the layer 14 in the (111) plane. That is, the upper portion of the sidewall structure is thicker than the lower portion, effectively blocking dopant from penetrating into the gate structure and into the inversion layer.

Figure 17:
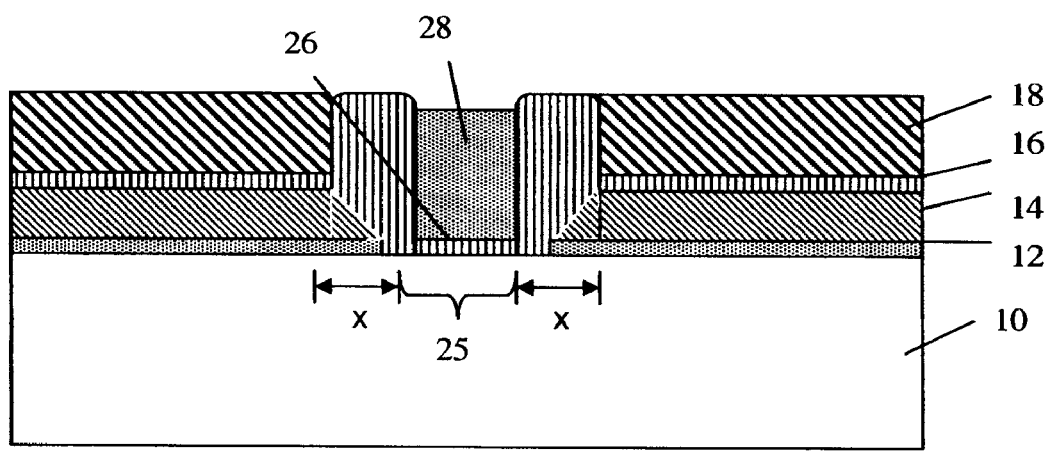

In FIG. 17, a gate oxide layer 26 is formed in the trench 22 using a thermal gate oxidation process known to those of skill in the art. A poly SiGe layer 28 is deposited in the trench 22, above the oxide layer 26. The poly SiGe layer 28 is etched back using conventional processes such as, for example, a wet etching process. In embodiments, the poly SiGe layer 28 has a content of about 1-5% Ge.

Figure 18:
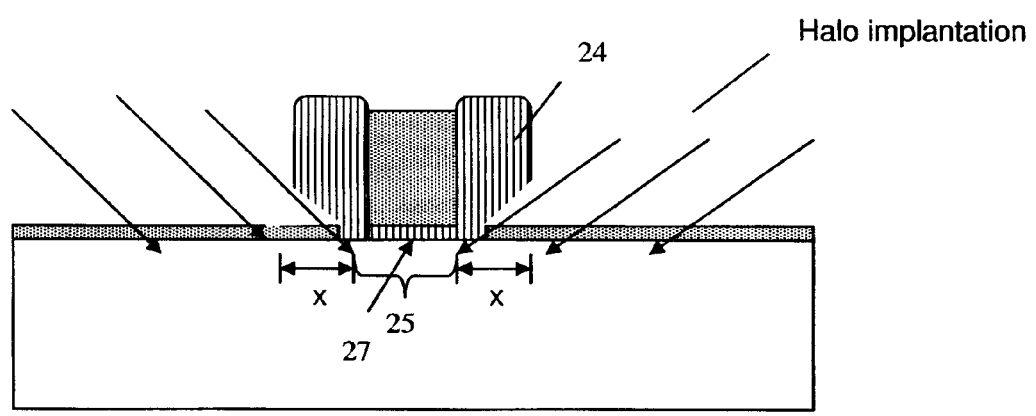

In FIG. 18, the nitride layer 18, oxide layer 16, and Si layer 14 are etched away using conventional etching processes. An angled halo implantation is conducted as show by the arrows. In embodiments, the halo implant is guided by the angled oxide spacer 24, forming the short channel under the gate. As discussed above, though, the thicker portion of the fan out oxide spacer prevents the doping from penetrating into the gate structure. That is, dopant does not stop in the inversion layer 27 under the gate structure, due to the increased thickness of the sidewalls 24b. The inversion layer 27 is about 5 Å to 30 Å.

In embodiments, boron is used for the halo implantation of nMOSFET and arsenic is used for the halo implantation of pMOSFET. In embodiments, the low halo concentration doping is performed at an angle that substantially matches the angle of the fan out oxide spacer 24, e.g., about 36° to the normal of the gate dielectric. The dopant concentration, in embodiments, is about a few $10^{17}$ atoms/cm$^3$ or less near the gate dielectric in the channel. It should be recognized by those of skill in the art that dopant is blocked or substantially blocked from penetrating the gate structure (e.g., SiGe layer 28) due to the increased thickness of the fan out spacer at the gate level, denoted generally at reference numeral 24b.

Figure 19:
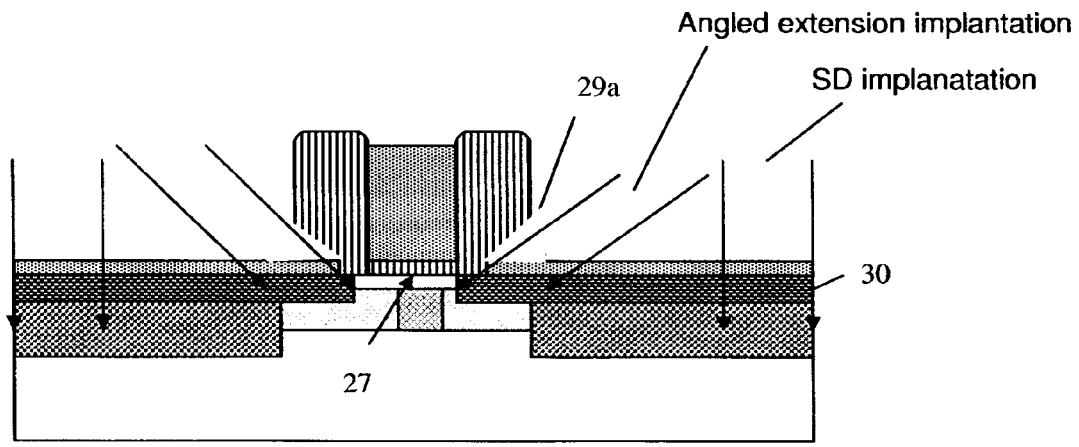

In FIG. 19, an angled extension implantation and source-drain implantation are conducted. For example, nMOSFET is implanted with arsenic at about an energy level of between 20 to 60 Kev at a dosage of about $1e^{15}$ to $5e^{15}$. pMOSFET is implanted with boron or BF$_2$. In the embodiment of boron, the boron can be implanted at an energy level of between 5 to 10 Kev at a dosage of about $1e^{15}$ to $5e^{15}$. In comparison, in the BF$_2$ embodiment, the BF$_2$ can be implanted at an energy level of between 20 to 50 Kev at a dosage of about $1e^{15}$ to $5e^{15}$. Regardless of the implant, it should be recognized by those of skill in the art that the implantation process will be performed away from the gate channel by a length of approximately "x", which is equivalent to the thickness of the oxide spacer 24 as represented by sidewall surface 24b. This ensures that a low concentration of dopant remains within the inversion layer 27 under the gate structure, while a higher concentration results at the source and drain regions.

An extension implant is performed in the source and drain regions. More specifically, arsenic is implanted as an extension implant at the N+ side of the device and boron is implanted as an extension implant at the P+ side of the device. In embodiments, the arsenic and boron can be implanted at an energy of about 2-4 Kev and at a dosage of about $1e^{15}$ to $2e^{15}$. In embodiments using BF$_2$, the BF$_2$ is implanted at an energy of about 3-5 Kev.

Figure 20:
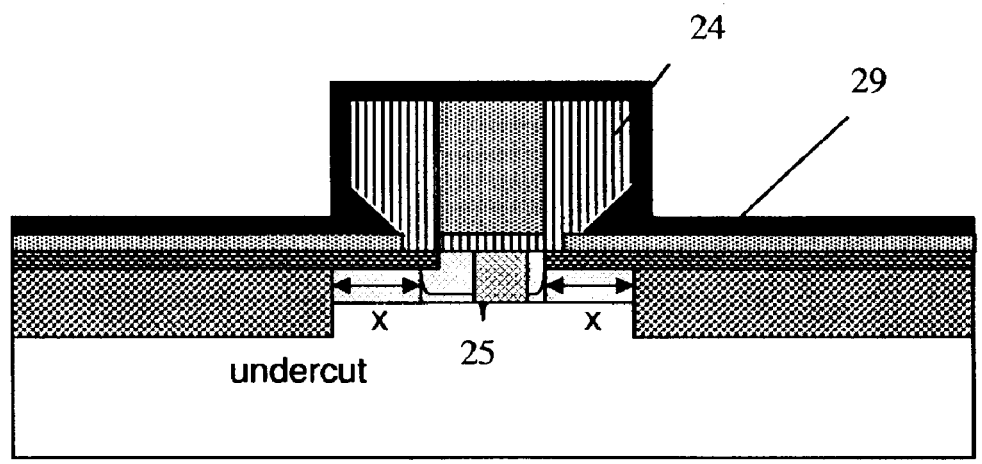

In FIG. 20, a nitride layer 29 is deposited over the structure using a conformal deposition process. That is, the nitride layer 29 is formed over the SiGe layer 12, the oxide sidewalls 24 and the gate structure, as well as in the undercut of the oxide sidewalls 24.

Figure 21:
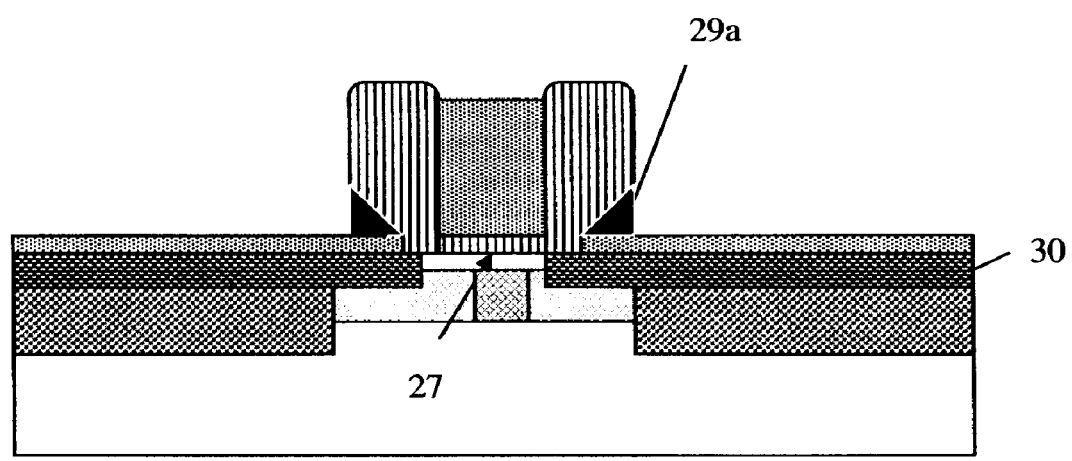
FIG. 21 shows processing steps and a final structure in accordance with the second aspect of the invention.

In FIG. 21, the nitride layer 29 is etched using a conventional etching process. In this etching process, nitride 29a remains within the undercut of the oxide sidewalls 24. After this step, conventional processes can be provided, such as, for example, activation anneal and silicidation to finish the device build.

Figure 22:
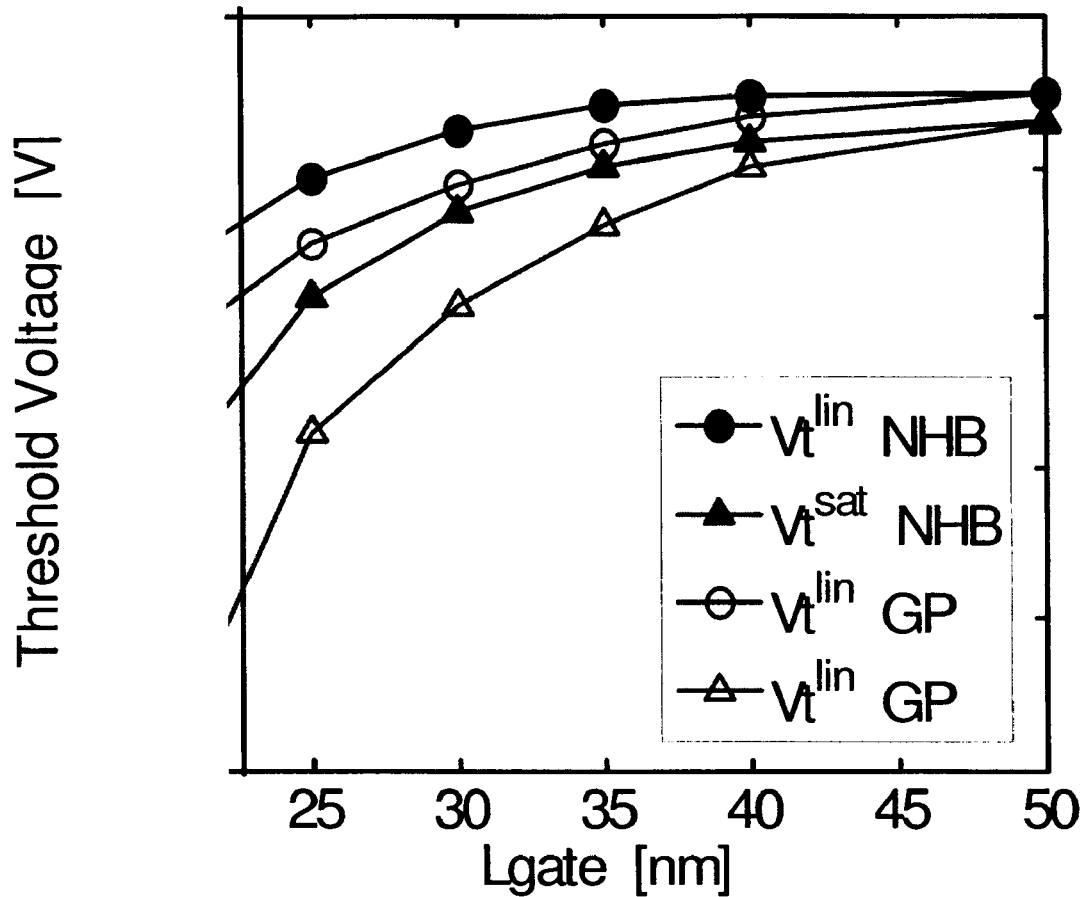
FIG. 22 shows a comparison graph of Vt roll off using embodiments of the invention.
Figure 23:
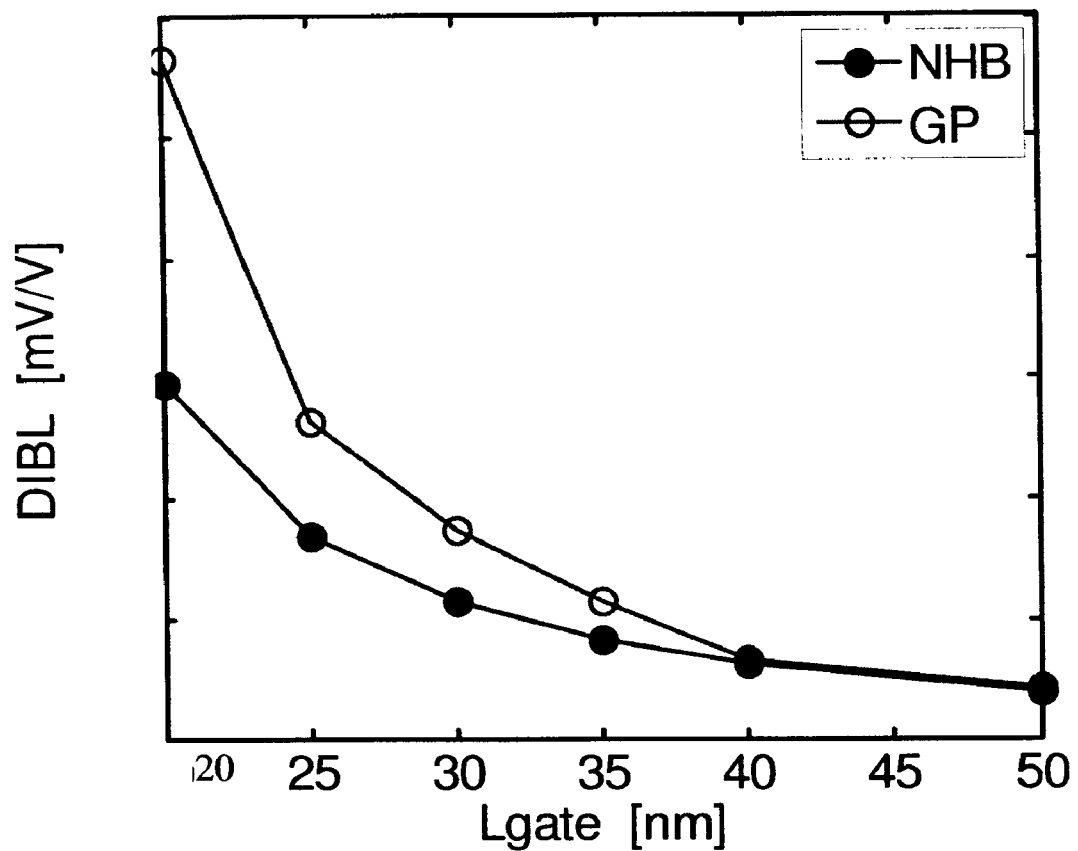
FIG. 23 a comparison graph of DIBL (drain induced barrier lowering) using embodiments of the invention.

FIG. 22 shows a comparison graph of Vt roll off using embodiments of the invention. As shown representatively in FIG. 23, $V_t$ for NHB refers to the voltage threshold associated with the present invention; whereas, $V_t$ for GB refers to the voltage threshold for a conventional device. "lin" refers to a linear mode and "sat" refers to saturation. As shown in FIG. 23, the present invention provides an improved Vt roll-off than the conventional system, as shown by the increased threshold voltage over gate length. Accordingly, there is an increased short channel control with the structure of the present invention. In fact, as shown representatively, the short channel control is increased by about 70%, compared to conventional devices.

FIG. 23 shows a comparison graph of BIBL (drain induced barrier lowering) using embodiments of the invention. Similar to FIG. 23, NHB refers to the present invention; whereas, GB refers to a conventional device. As shown representatively, the NHB (present invention) provides an improved DIBL than the GP (conventional structure) at gate lengths about less than 40 nm.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

It is claimed:

1. A method of forming a structure, comprising:
forming an angled spacer adjacent a gate structure; and
implanting a halo implant at an angle to form a halo profile having low dopant concentration near a gate dielectric under the gate structure, wherein the forming the angled spacer includes patterning a layer to have a surface in a (111) plane.

2. The method of claim 1, wherein the layer is an Si layer.

3. The method of claim 1, wherein the forming the angled spacer comprises:
etching a nitride layer and an oxide layer to form a first opening;
etching an Si layer to have an angled opening;
etching an SiGe layer to an underlying substrate or wafer to form a second opening, narrower than the first opening;
depositing an oxide material in the first opening, the angled opening and the second opening and etching portions of the oxide material to form a gate opening and the angled spacer;
depositing portions of a gate structure within the gate opening; and
removing the nitride layer, the oxide layer and the Si layer.

4. The method of claim 3, wherein the angled spacer has an angled surface complimentary to the angled opening.

5. The method of claim 1, wherein the angled surface is in a (111) plane.

6. The method of claim 1, wherein the angled spacer is a fan out oxide spacer which blocks dopants from penetrating into an inversion region during said halo implant.

7. The method of claim 1, wherein said low dopant concentration near the gate dielectric under the gate structure is of about $10^{17}$ atoms/cm$^3$.

8. The method of claim 1, further comprising preventing doping in a gate channel during doping source and drain regions.

9. The method of claim 1, further comprising performing an angled extension implant prior to the formation of the nitride layer within the undercuts of the angled spacer.

10. The method of claim 1, further comprising stripping away the angled spacer and performing an extension implantation process.

11. A method of forming a structure, comprising:
forming an angled spacer adjacent a gate structure; and
implanting a halo implant at an angle to foam a halo profile having low dopant concentration near a gate dielectric under the gate structure, wherein the implanting is guided by an angled surface of the angled spacer.

12. A method of forming a structure, comprising:
forming an angled spacer adjacent a gate structure; and
implanting a halo implant at an angle to form a halo profile having low dopant concentration near a gate dielectric under the gate structure, wherein the angled spacer has a sidewall thicker at an upper portion than a lower portion, near a channel of a gate.

13. A method of forming a structure, comprising:
forming an angled spacer adjacent a gate structure; and
implanting a halo implant at an angle to form a halo profile having low dopant concentration near a gate dielectric under the gate structure; and
forming a nitride layer within undercuts of the angled spacer.

14. A method of forming a device, comprising:
etching layers above a substrate or wafer to form a trench having an angled surface in a (111) plane;
forming an angled gate spacer within the angled opening, the angled gate spacer having a portion of its sidewall complimentary to the angled surface;
removing upper layers of the layers;
performing an angled implant of a low halo concentration, wherein the angled gate spacer prevents penetration into a gate structure and an underlying surface; and
removing the angled gate spacer.

15. The method of claim 14, wherein the performing of the angled implant of the low halo concentration is guided by the angled gate spacer.

16. The method of claim 14, further comprising performing an angled extension doping and doping source and drain regions prior to a conformal deposition of a nitride layer in an undercut of the angled spacer.

* * * * *